(12) United States Patent
Rocker et al.

(10) Patent No.: US 11,611,182 B2
(45) Date of Patent: Mar. 21, 2023

(54) EXCHANGEABLE EXTENDED LIFE CONNECTIONS FOR MASS INTERCONNECTS

(71) Applicant: Virginia Panel Corporation, Waynesboro, VA (US)

(72) Inventors: David L Rocker, Earlysville, VA (US); Randall L Herron, Waynesboro, VA (US); Randall C Garman, Waynesboro, VA (US); Darryl M Ashby, Weyers Cave, VA (US)

(73) Assignee: Virginia Panel Corporation, Waynesboro, VA (US)

( * ) Notice: Subject to any disclaimer, the term of this patent is extended or adjusted under 35 U.S.C. 154(b) by 0 days.

(21) Appl. No.: 17/092,572

(22) Filed: Nov. 9, 2020

(65) Prior Publication Data

US 2021/0143592 A1    May 13, 2021

Related U.S. Application Data

(60) Provisional application No. 62/933,953, filed on Nov. 11, 2019.

(51) Int. Cl.
| | |
|---|---|
| *H01R 24/00* | (2011.01) |
| *H01R 27/02* | (2006.01) |
| *G01R 1/04* | (2006.01) |
| *H01R 12/72* | (2011.01) |
| *H01R 13/42* | (2006.01) |
| *H01R 13/518* | (2006.01) |
| *H01R 31/06* | (2006.01) |

(52) U.S. Cl.
CPC ........... *H01R 27/02* (2013.01); *G01R 1/0416* (2013.01); *H01R 12/724* (2013.01); *H01R 13/42* (2013.01); *H01R 13/518* (2013.01); *H01R 31/06* (2013.01); *H01R 2201/20* (2013.01)

(58) Field of Classification Search
CPC .... H01R 12/724; H01R 13/42; H01R 13/518; H01R 27/02; H01R 31/06; H01R 2201/20; G01R 1/0416
USPC .......................................................... 439/629
See application file for complete search history.

(56) References Cited

U.S. PATENT DOCUMENTS

| | | | |
|---|---|---|---|
| 4,329,005 A | 5/1982 | Braginetz et al. | |
| 5,562,458 A | 10/1996 | Casey et al. | |
| 5,966,023 A | 10/1999 | Burgers et al. | |
| 6,563,714 B2 * | 5/2003 | Chang | H01R 27/02 361/728 |
| 7,297,014 B1 | 11/2007 | Garman et al. | |
| 7,316,579 B2 | 1/2008 | Roath et al. | |
| 7,491,095 B1 * | 2/2009 | Huang | H01R 12/716 439/682 |

(Continued)

FOREIGN PATENT DOCUMENTS

WO    2019037815 A1    2/2019

*Primary Examiner* — Abdullah A Riyami
*Assistant Examiner* — Vladimir Imas
(74) *Attorney, Agent, or Firm* — 24IP Law Group USA, PLLC; Timothy R DeWitt

(57) ABSTRACT

An interface having a frame with a plurality of slots, a first pass-through insert in the frame and a second pass-through insert in the frame. The first pass-through insert and the second pass-through insert each have a housing and a contact with the type of contact in the first pass-through insert is different than the type of contact in the second pass-through housing.

13 Claims, 11 Drawing Sheets

(56) References Cited

U.S. PATENT DOCUMENTS

| | | | |
|---|---|---|---|
| 7,602,611 B2* | 10/2009 | Peng | H05K 7/1429 |
| | | | 361/728 |
| 8,348,693 B2 | 1/2013 | Stowers et al. | |
| 8,708,750 B2* | 4/2014 | Ho | H01R 27/02 |
| | | | 439/639 |
| 8,721,353 B2* | 5/2014 | Xu | H01R 24/76 |
| | | | 439/108 |
| 8,986,047 B2* | 3/2015 | Lai | G06F 1/185 |
| | | | 439/328 |
| 9,004,941 B2* | 4/2015 | Wang | H01R 24/60 |
| | | | 439/607.01 |
| 9,246,286 B2 | 1/2016 | Stowers et al. | |
| 9,685,727 B2 | 6/2017 | Ashby et al. | |
| 10,511,127 B2* | 12/2019 | Chang | H05K 1/117 |
| 2005/0202726 A1* | 9/2005 | Chou | H01R 13/514 |
| | | | 439/639 |
| 2010/0194417 A1 | 8/2010 | Ashby et al. | |
| 2010/0248522 A1 | 9/2010 | Crofoot et al. | |
| 2011/0177699 A1 | 7/2011 | Crofoot et al. | |
| 2013/0102199 A1 | 4/2013 | Venaleck et al. | |

* cited by examiner

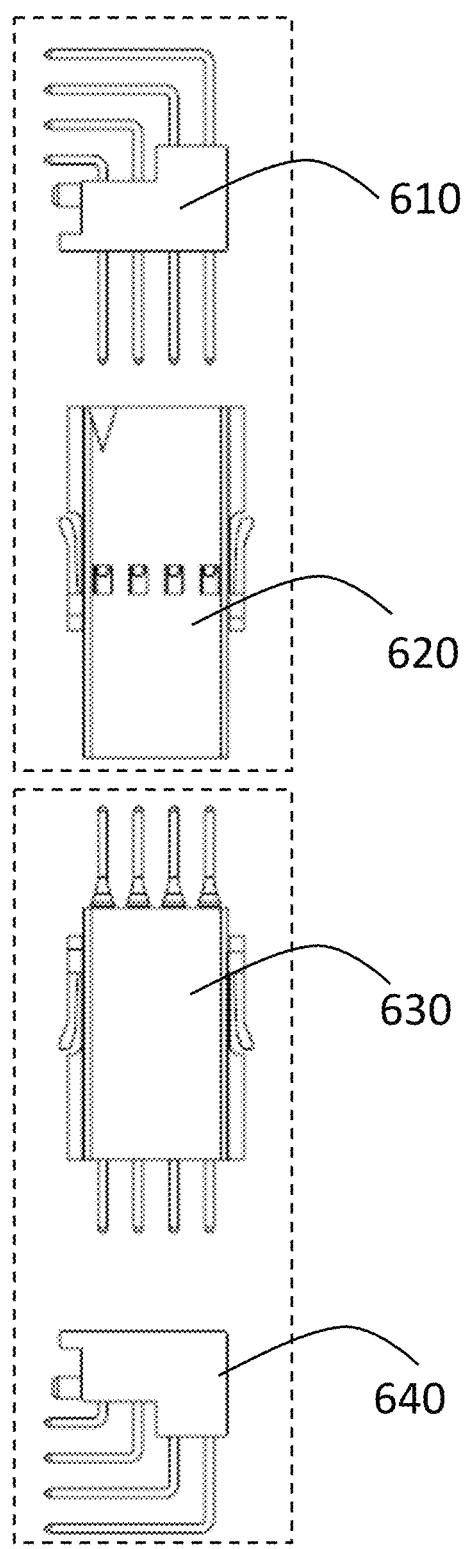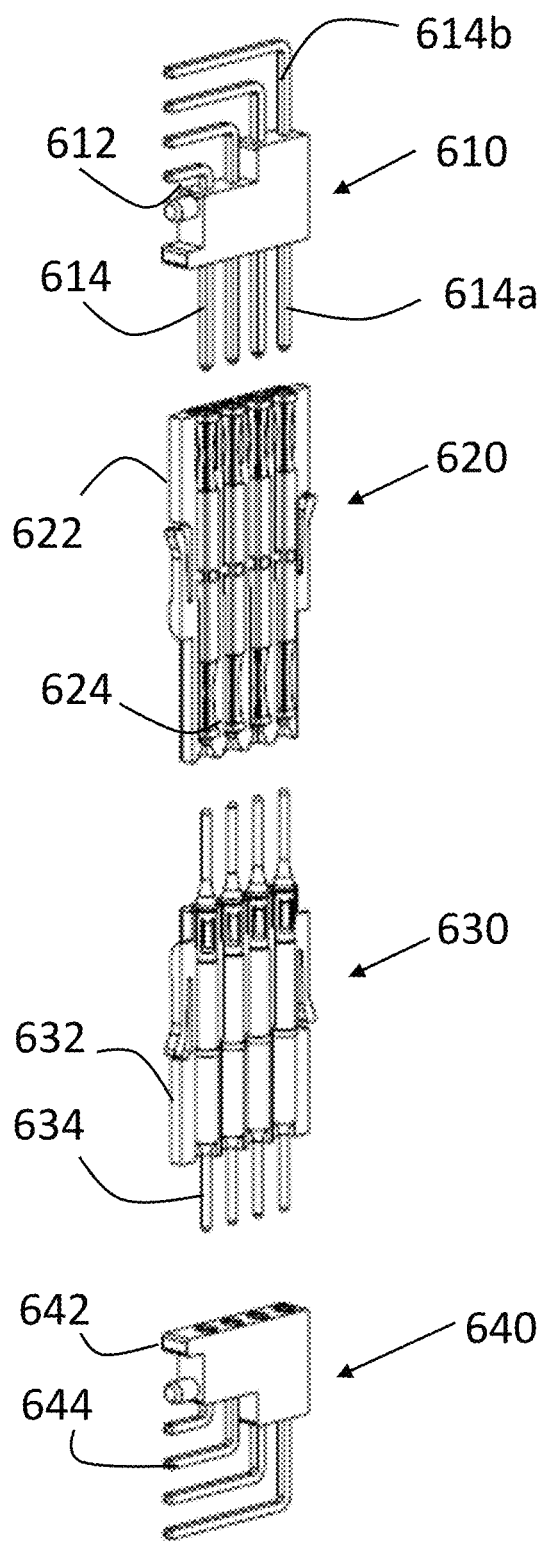
FIG. 6A
FIG. 6B

EXCHANGEABLE EXTENDED LIFE CONNECTIONS FOR MASS INTERCONNECTS

CROSS-REFERENCE TO RELATED APPLICATIONS

The present application claims the benefit of the filing date of U.S. Provisional Patent Application Ser. No. 62/933,953 filed by the present inventors on Sep. 11, 2019.

The aforementioned provisional patent application is hereby incorporated by reference in its entirety.

STATEMENT REGARDING FEDERALLY SPONSORED RESEARCH OR DEVELOPMENT

None.

BACKGROUND OF THE INVENTION

Field of the Invention

The present invention relates to high life cycle interface or mass interconnect devices.

Brief Description of the Related Art

A variety of high life cycle and mass interconnect devices for use with various contacts are known. One example of a conventional high life-cycle interconnect device or interface system is the mass interconnect device disclosed in U.S. Pat. No. 4,329,005, entitled "Slide Cam Mechanism for Positioning Test Adapter in Operative Relationship with a Receiver." Other prior art engagement systems include those disclosed in U.S. Pat. Nos. 5,966,023, 5,562,458, 7,297,014, U.S. Patent Application Publication No. 2010/0194417, and U.S. Pat. No. 8,348,693.

A variety of high-speed data contacts have been developed and used along with various modules for housing such high-speed data contacts. Examples include those disclosed in U.S. Patent Application Publication No. 2013/0102199, entitled "Hermaphroditic Interconnect System," U.S. Patent Application Publication No. 2011/0177699 entitled "Backplane Cable Interconnection," U.S. Patent Application Publication No. 2010/0248522 entitled "Electrical Cable Connection Latch System" and U.S. Pat. No. 7,316,579, entitled "Zero Insertion Force Cable Interface." Additional high-speed data contact systems are known, for example, as the "FCI Examax." While these prior high-speed data contact systems had various advantages, none were specifically adapted for use in high life cycle systems designed to perform for thousands or tens of thousands of connection cycles or for mass interconnect systems.

More recently, U.S. Pat. Nos. 9,246,286 and 9,685,727 disclosed high-speed data modules. The above patents and published applications are hereby incorporated by reference in their entirety.

SUMMARY OF THE INVENTION

In a preferred embodiment, the present invention is a system or assembly in which a plurality of types of contacts (e.g., high speed data, power, signal) can be used simultaneously in a module and at least some of the plurality of contacts can be removed from the front of the module and replaced without disassembling the remainder of the module. The system or assembly achieves this front removal and replacement via a pass-thru or separable insert that snaps into the module using latches on opposite sides of the insert. This allows replacement of the contacts in the insert, which are subject to repetitive mating and un-mating cycles with another module (such as a test adapter or ITA module mating and un-mating with a receiver module).

In another preferred embodiment, the present invention is an interface. The interface has a frame having a front face, a rear face and a plurality of identical slots, a first pass-through insert in the frame, the first pass-through insert having a housing and a plurality of a first type of contact in the housing, the first pass-through insert being secured in the frame, a second pass-through insert in the frame, the second pass-through insert having a housing and a plurality of a second type of contact in the housing, the second type of contact being secured in the frame, wherein the second type of contact is different than the first type of contact. The first pass-through insert may be secured in one of the plurality of slots in the frame. The first type of contact may be one of a signal contact and a high-speed data contact. The second pass-through insert may be secured in a plurality of the of the plurality of slots in the frame. The interface may further comprise a first contact set having a first end connected to the first pass-through insert and a second end adapted to connect to a printed circuit board and a second contact set having a first end connected to the second pass-through insert and a second end adapted to connect to the printed circuit board.

In yet another embodiment, the present invention is an interface (100) having a test adapter assembly and a receiver assembly. The test adapter assembly further comprises a test adapter frame having a front face, a rear face and a plurality of identical slots, a plurality of first pass-through inserts secured in the test adapter frame, each the first pass-through insert having a first housing and a plurality of a first type of contact in the first housing, the plurality of first pass-through inserts being secured in the test adapter frame, and a plurality of second pass-through inserts in the test adapter frame, each the second pass-through insert having a second housing and a plurality of a second type of contact in the second housing, the second type of contact being secured in the test adapter frame, wherein the second type of contact is different than the first type of contact. The receiver assembly comprises a receiver frame having a front face, a rear face and a plurality of identical slots, a plurality of third pass-through inserts in the receiver frame, each the third pass-through insert having a third housing and a plurality of a third type of contact in the third housing, the third type of contact being adapted to connect to the first type of contact, the plurality of third pass-through inserts being secured in the receiver frame in positions corresponding to positions of the first pass-through inserts in the test adapter frame, and a plurality of fourth pass-through inserts in the receiver frame, each the fourth pass-through insert having a fourth housing and a plurality of a fourth type of contact in the fourth housing, the fourth type of contact being adapted to connect to the second type of contact and the plurality of fourth pass-through inserts being secured in the receiver frame in positions corresponding to positions of the second pass-through inserts in the test adapter frame.

In yet another embodiment, the present invention is an interface having a test adapter assembly. The test adapter assembly comprises a test adapter frame having a front face, a rear face and a plurality of identical slots, a power pass-through insert in the test adapter frame, the power pass-through insert having a housing and a plurality of power contacts in the housing, the power pass-through insert being secured in the frame, a signal pass-through insert in the test adapter frame, the signal pass-through insert (620) having a housing and a plurality of signal contacts in the housing, the signal pass-through insert being secured in the test adapter frame.

Still other aspects, features, and advantages of the present invention are readily apparent from the following detailed description, simply by illustrating a preferable embodiments and implementations. The present invention is also capable of other and different embodiments and its several details can be modified in various obvious respects, all without departing from the spirit and scope of the present invention. Accordingly, the drawings and descriptions are to be regarded as illustrative in nature, and not as restrictive. Additional objects and advantages of the invention will be set forth in part in the description which follows and in part will be obvious from the description or may be learned by practice of the invention.

BRIEF DESCRIPTION OF THE DRAWINGS

For a more complete understanding of the present invention and the advantages thereof, reference is now made to the following description and the accompanying drawings, in which:

FIG. 6A is a top assembly view of a signal contact assembly of a high life-cycle separable test adapter assembly in accordance with a preferred embodiment of the present invention.

FIG. 6B is a cutaway top assembly view of a signal contact assembly of a high life-cycle separable test adapter assembly in accordance with a preferred embodiment of the present invention.

DETAILED DESCRIPTION OF THE PREFERRED EMBODIMENTS

Figure 1A:
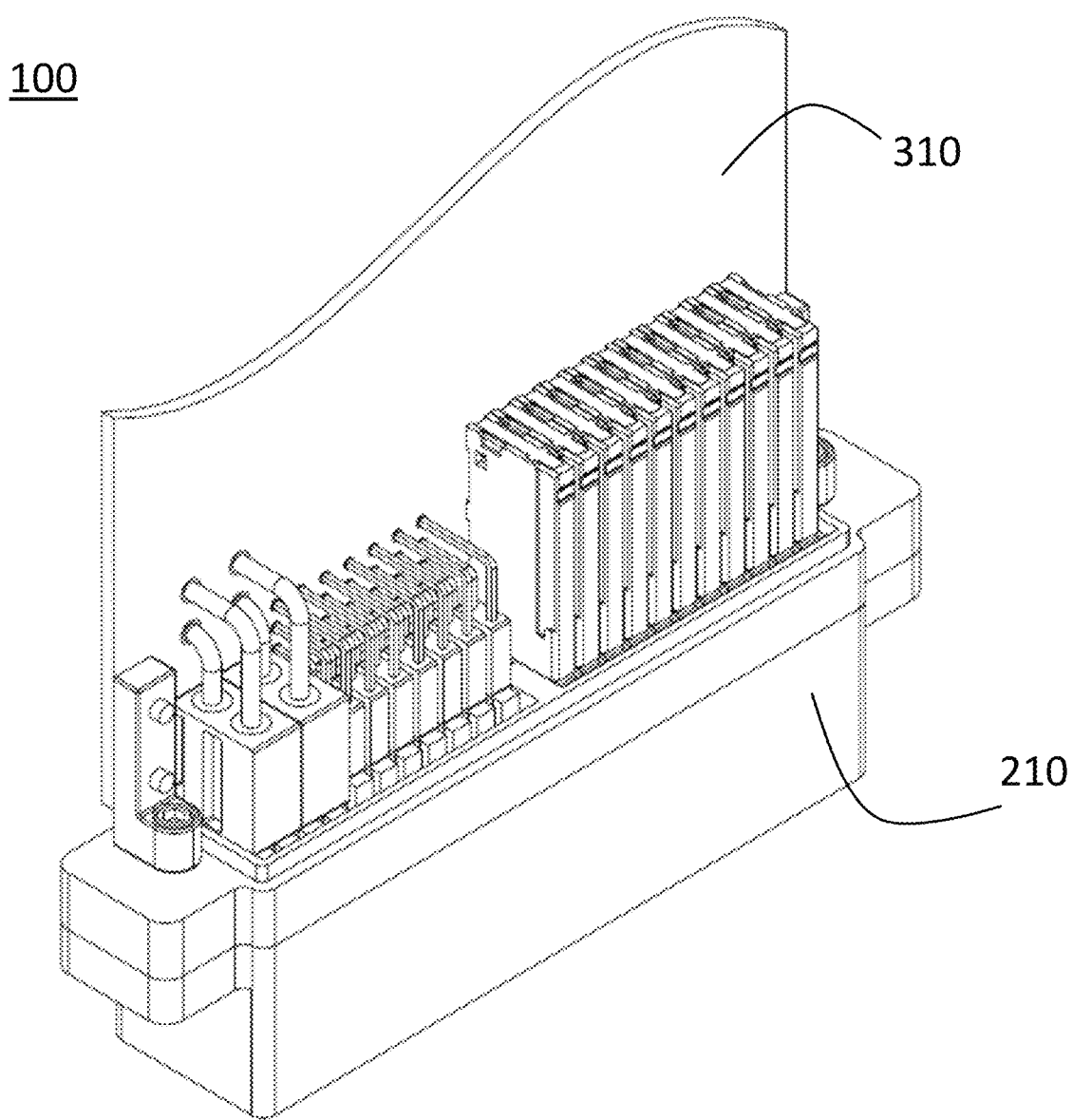
FIG. 1A is an isometric view of a high life-cycle separable test adapter assembly in accordance with a preferred embodiment of the present invention.
Figure 1B:
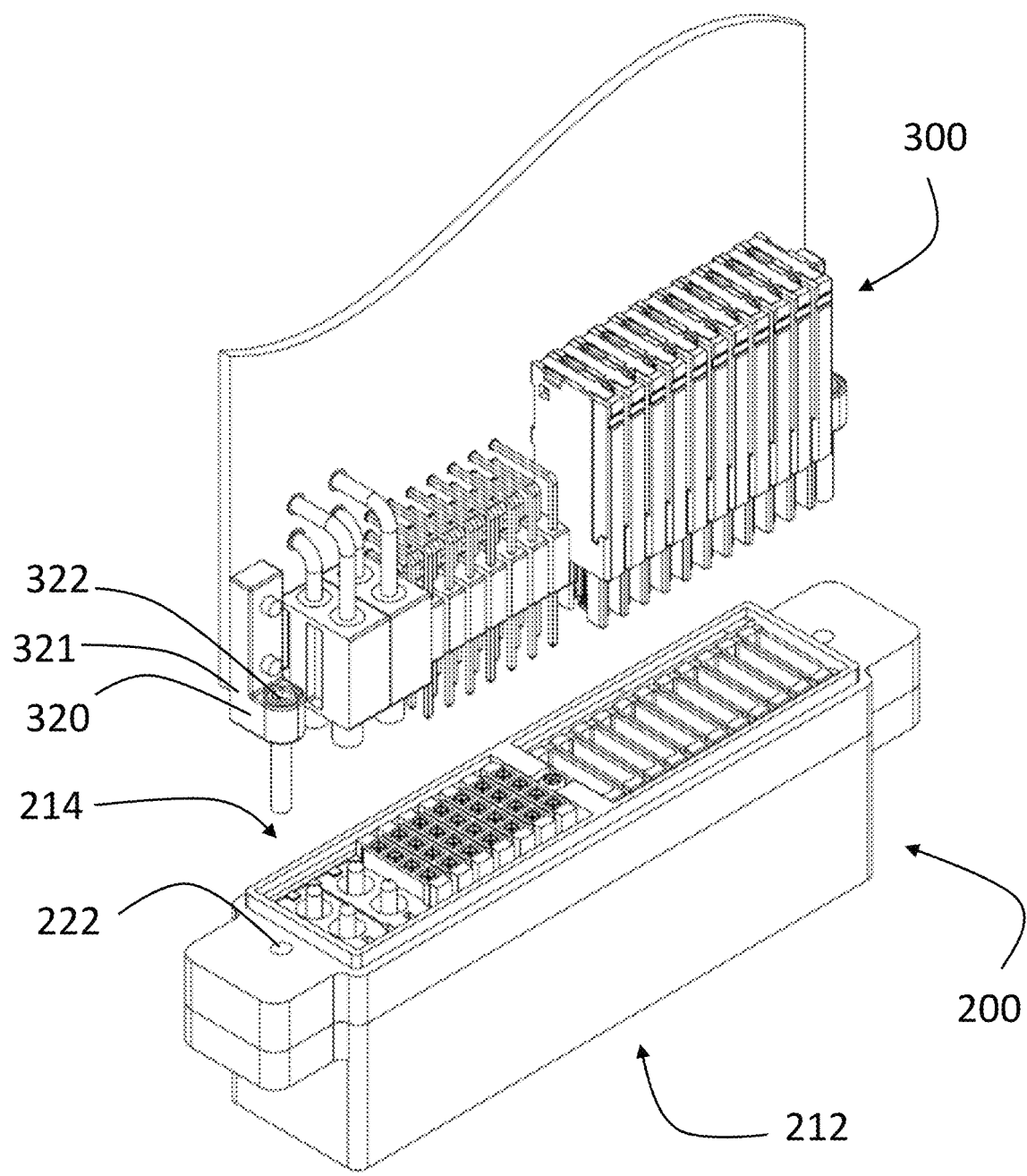
FIG. 1B is a separated isometric view of a high life-cycle separable test adapter assembly in accordance with a preferred embodiment of the present invention.
Figure 1C:
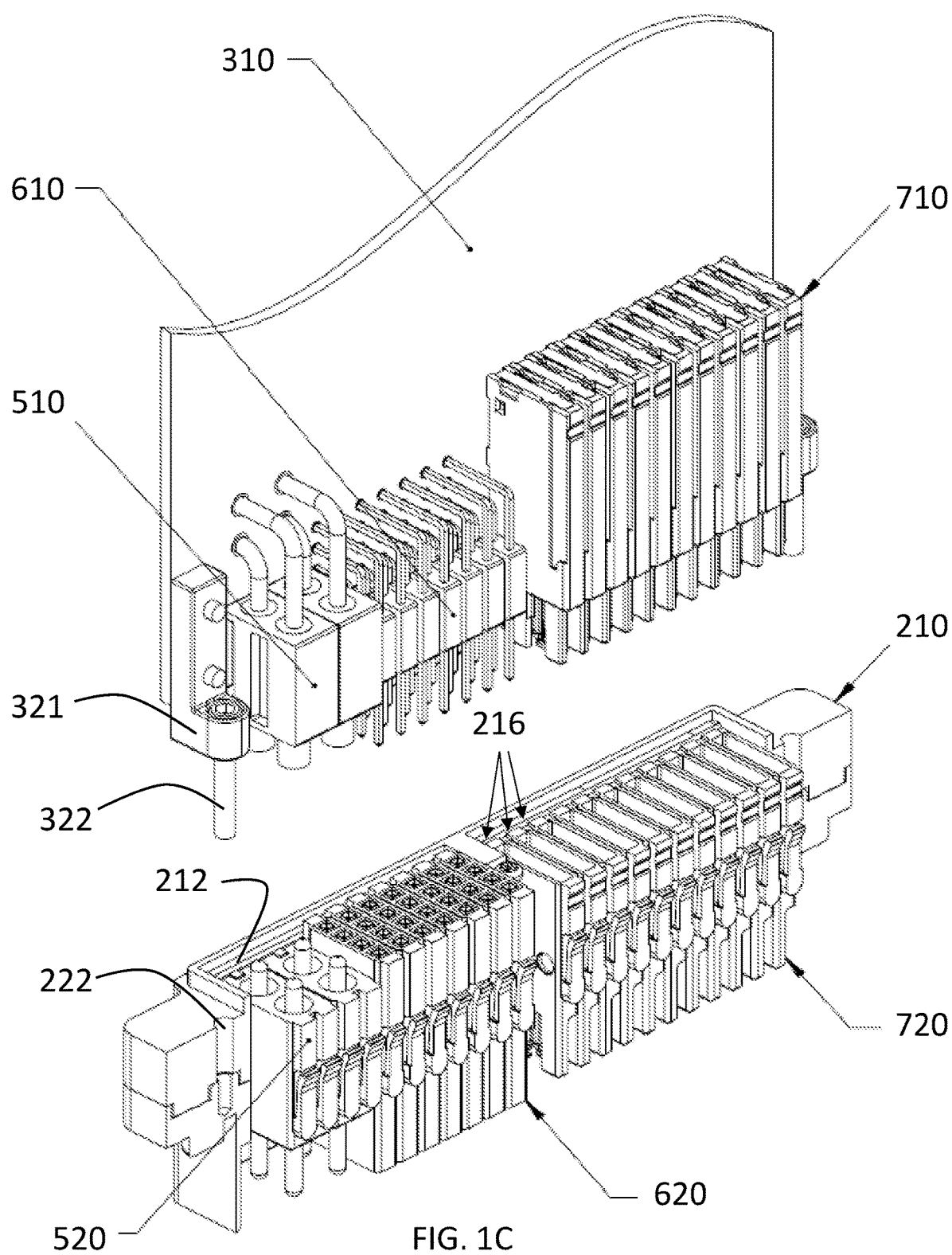
FIG. 1C is a cutaway separated isometric view of a high life-cycle separable test adapter assembly in accordance with a preferred embodiment of the present invention.
Figure 2A:
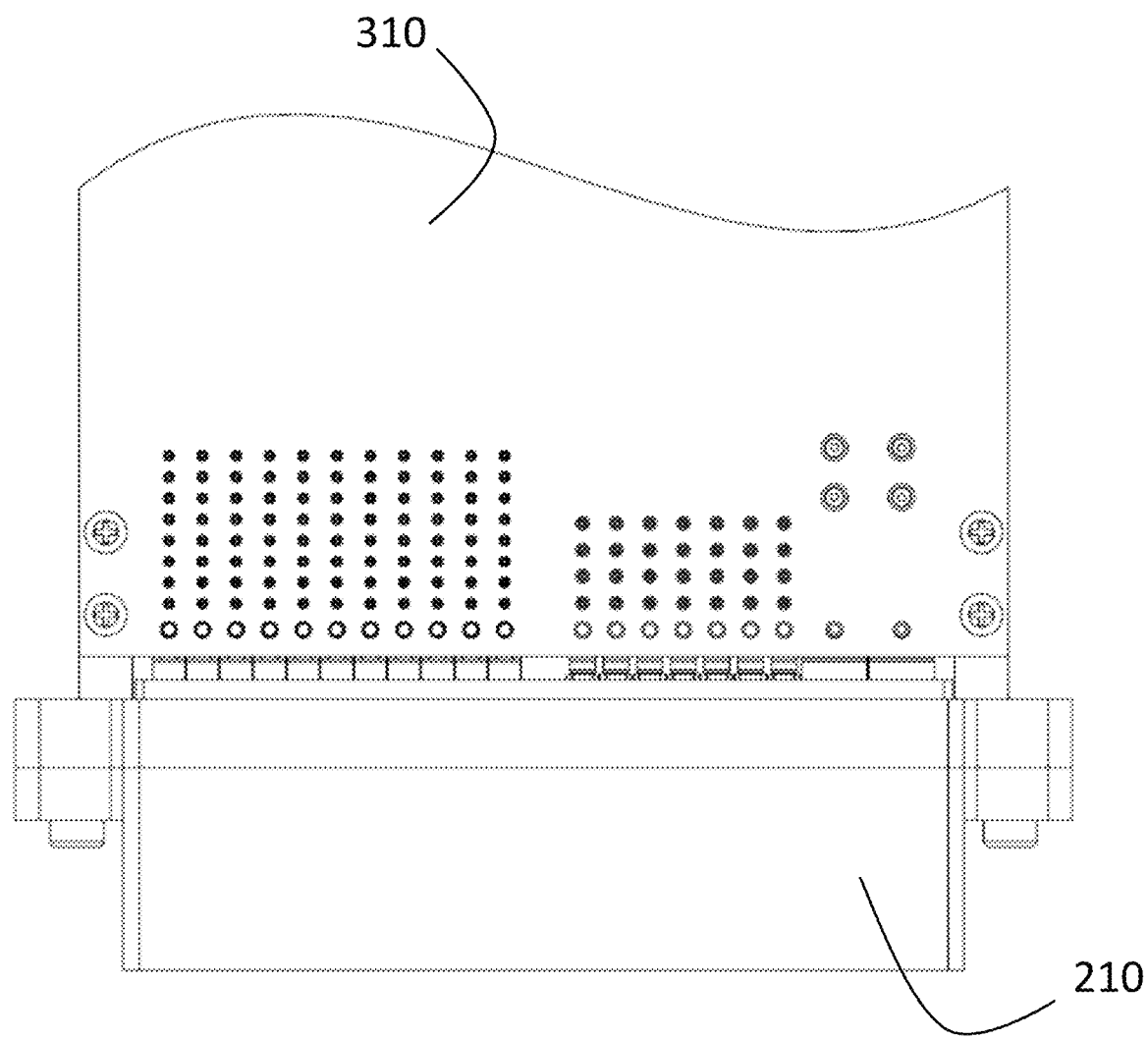
FIG. 2A is a solder side view of a high life-cycle separable test adapter assembly in accordance with a preferred embodiment of the present invention.
Figure 2B:
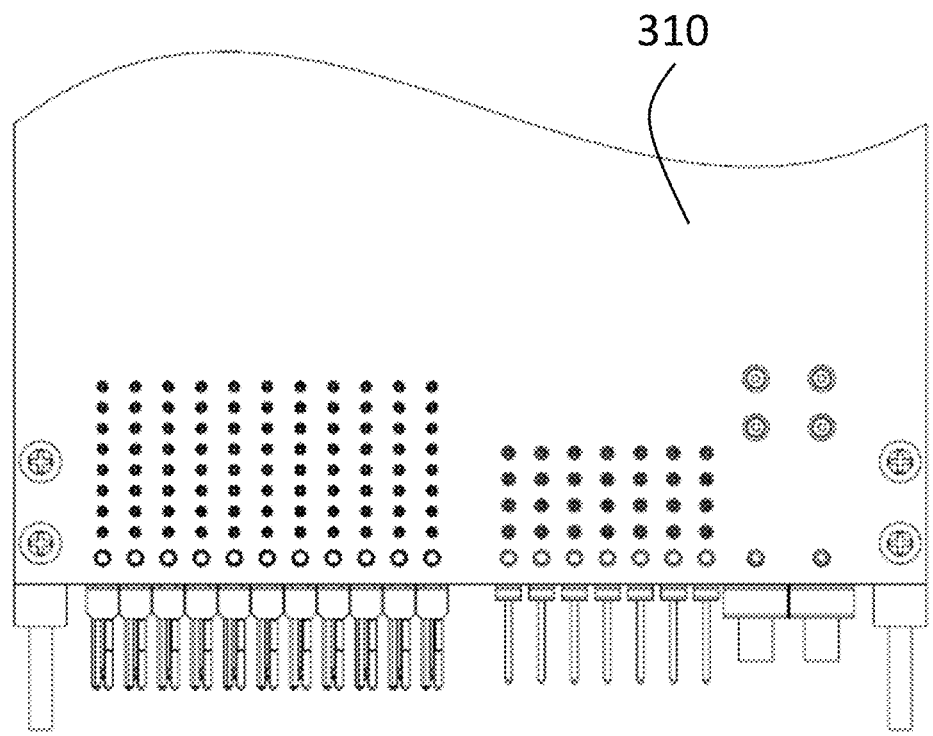
FIG. 2B is a separated solder side view of a high life-cycle separable test adapter assembly in accordance with a preferred embodiment of the present invention.
Figure 2B:
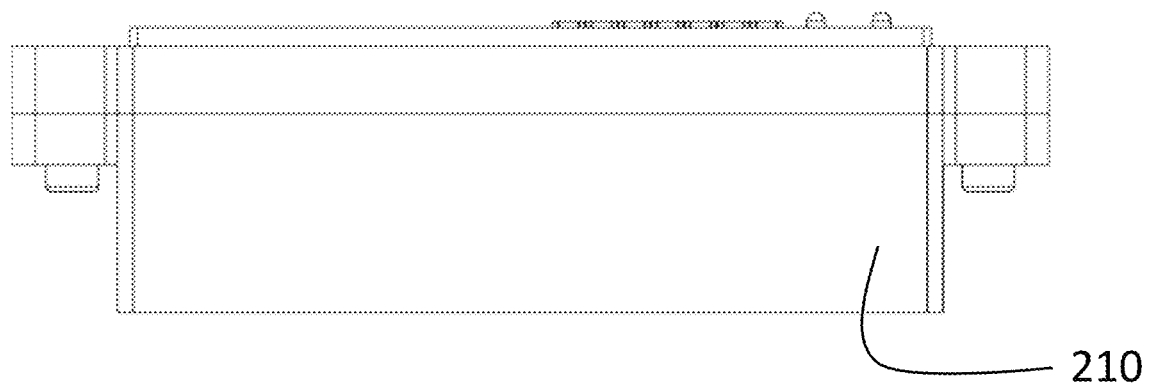
Figure 3A:
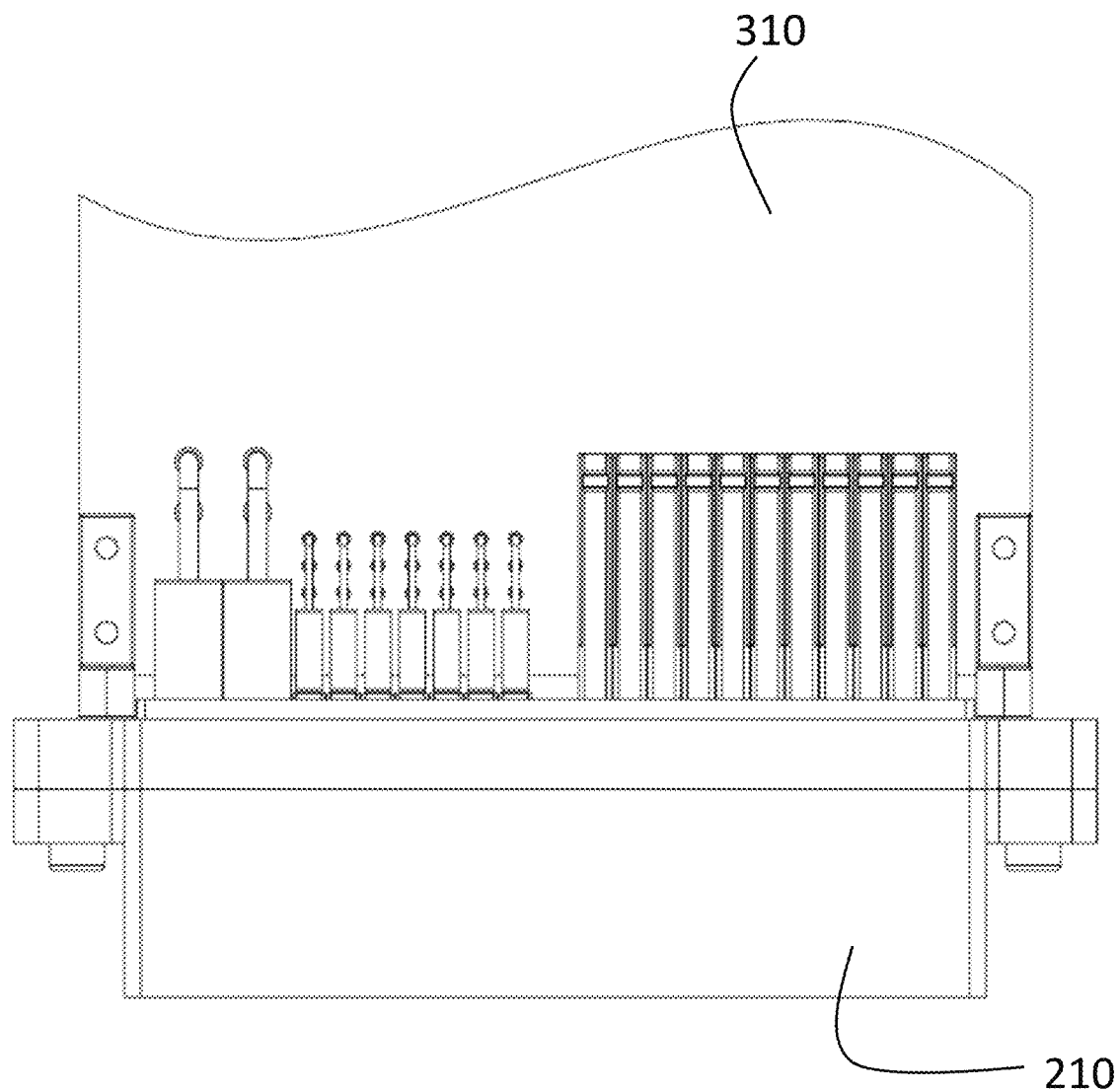
FIG. 3A is a component side view of a high life-cycle separable test adapter assembly in accordance with a preferred embodiment of the present invention.
Figure 3B:
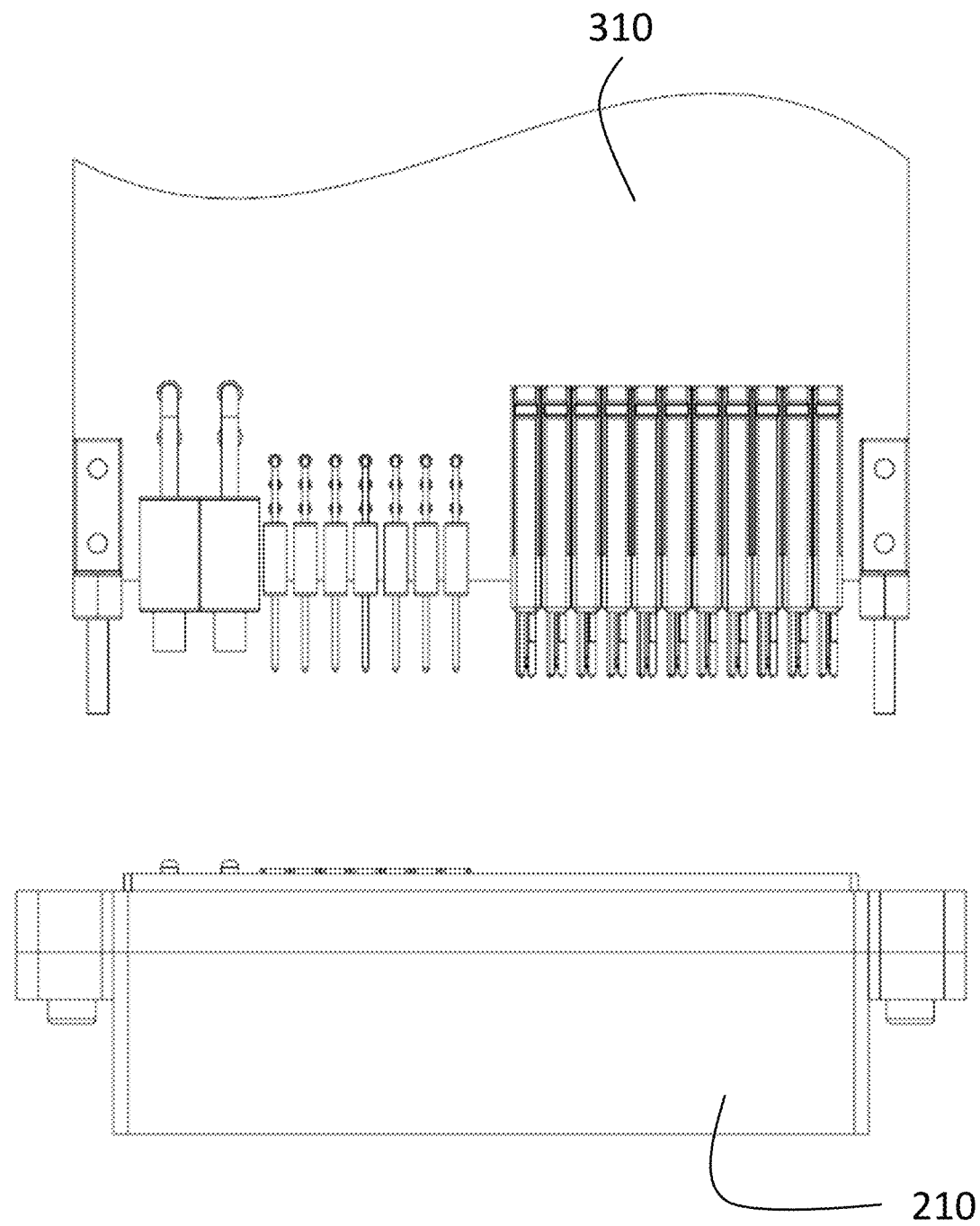
FIG. 3B is a separated component side view of a high life-cycle separable test adapter assembly in accordance with a preferred embodiment of the present invention.
Figure 4A:
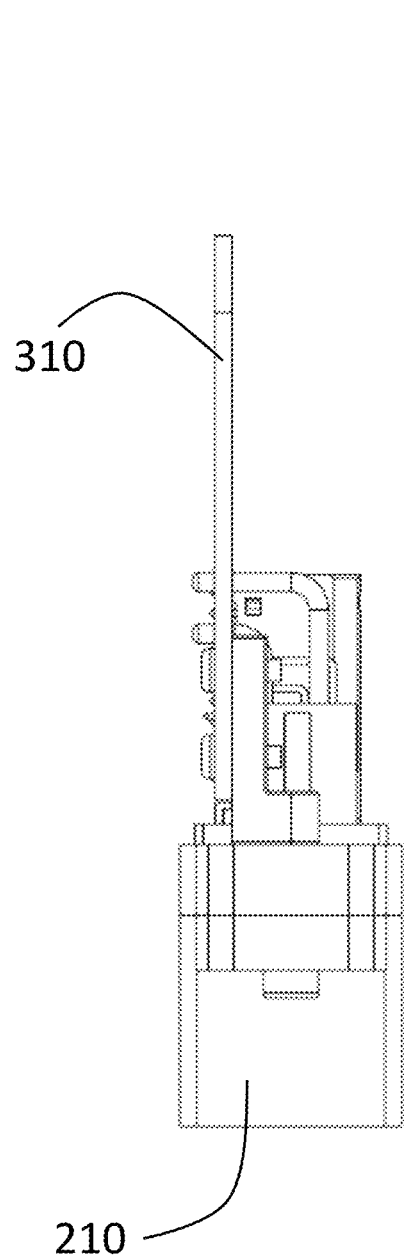
FIG. 4A is an end view of a high life-cycle separable test adapter assembly in accordance with a preferred embodiment of the present invention.
Figure 4B:
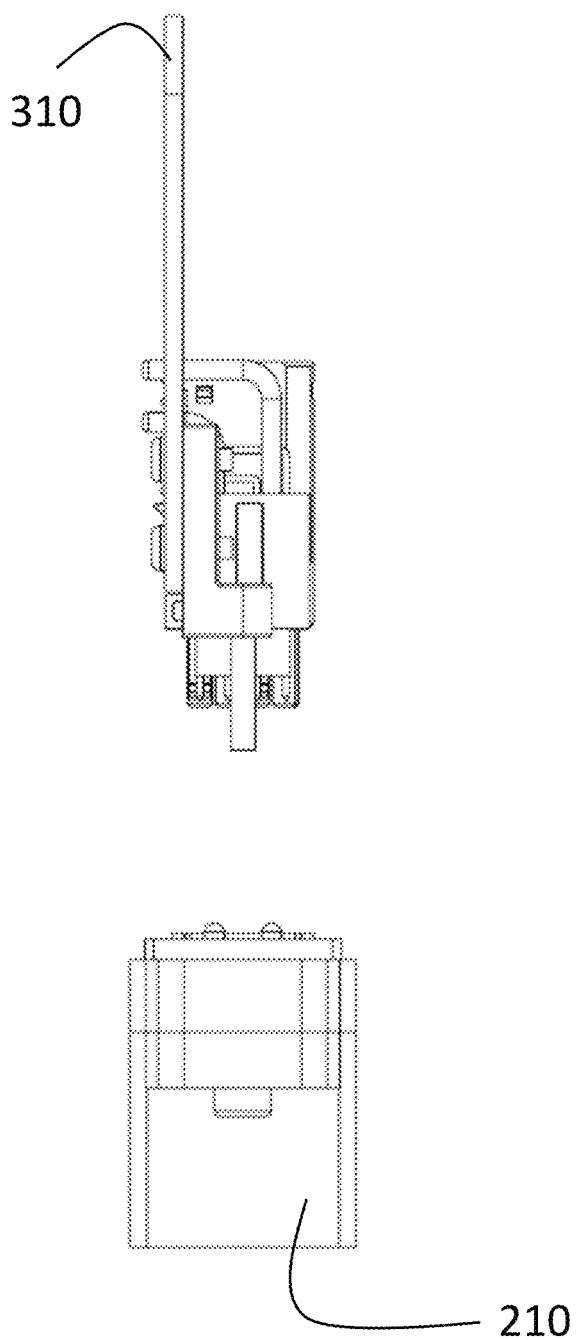
FIG. 4B is a separated end view of a high life-cycle separable test adapter assembly in accordance with a preferred embodiment of the present invention.

The preferred embodiments of the invention are shown and labelled in the accompanying drawings. In a preferred embodiment, the present invention is an interface module assembly (either test adapter or receiver side). In the example of an interface test adapter ("ITA") assembly, the assembly has an ITA frame assembly 200 and a printed circuit board ("PCB") assembly 300, as shown in FIGS. 1A-1C. The ITA frame assembly and PCB assembly can be connected to one another as shown in FIG. 1A or may be separated as shown in FIGS. 1B and 1C.

As shown FIG. 1C, the ITA frame assembly 200 has an ITA frame 210, a plurality of power contact pass-through inserts 520, a plurality of signal contact pass-through inserts 620, and a plurality of high-speed data contact pass-through inserts 720. Each of these pass-through inserts has a plurality of contacts in a rigid housing. Each of these types of inserts are designed to be individually replaceable or replaceable as a group from the front of the ITA frame.

The PCB assembly 300 has a PCB board 310, a plurality of right-angle micro-power contact sets 510, a plurality of right-angle signal contact sets 610 and a plurality of high-speed data contact sets 710 connected to the PCB 310. Each of these "contact sets" has a plurality of contacts secured in a single rigid housing. In "right-angle" contact sets each contact has a first end extending along an axis along the length of the contact set housing and a second end at a right angle (or other similar angle) relative to that axis of the contact set housing. With such an arrangement, the first end of each contact can easily mate with another contact set and the second end can easily connect to a PCB. The PCB assembly further has means 320 for removably securing the PCB assembly to the ITA frame. As shown in FIGS. 1A-1C, the means for connecting may be a bracket or other support structure 321 and a screw or bolt 322 that goes into, for example, a threaded hole 222 in the ITA frame when the two assemblies are connected together. Other known means for securing the two assemblies together may be used.

Figure 5A:
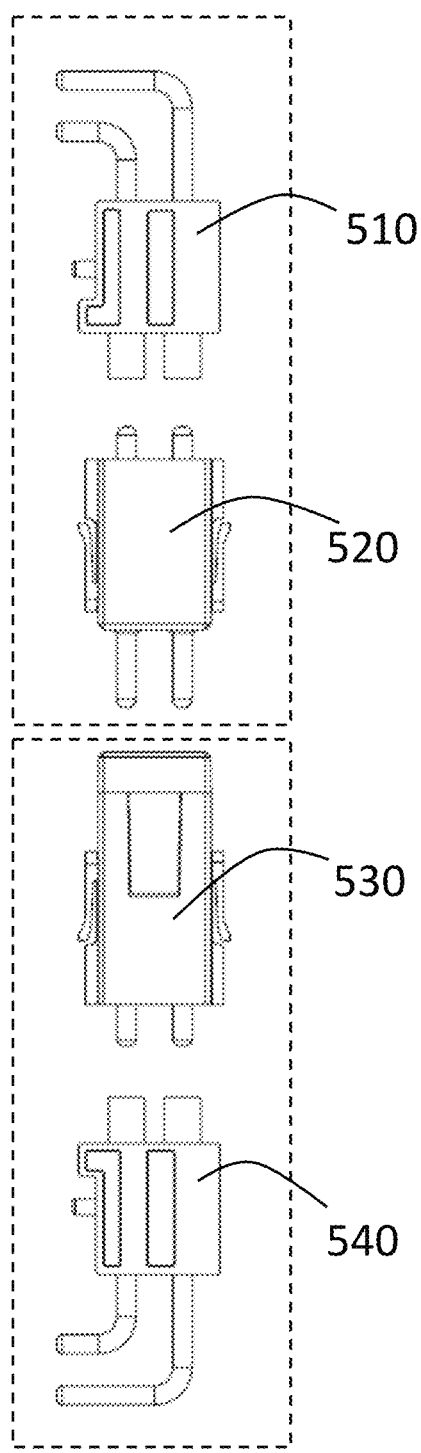
FIG. 5A is a top assembly view of a power contact assembly of a high life-cycle separable test adapter assembly in accordance with a preferred embodiment of the present invention.
Figure 5B:
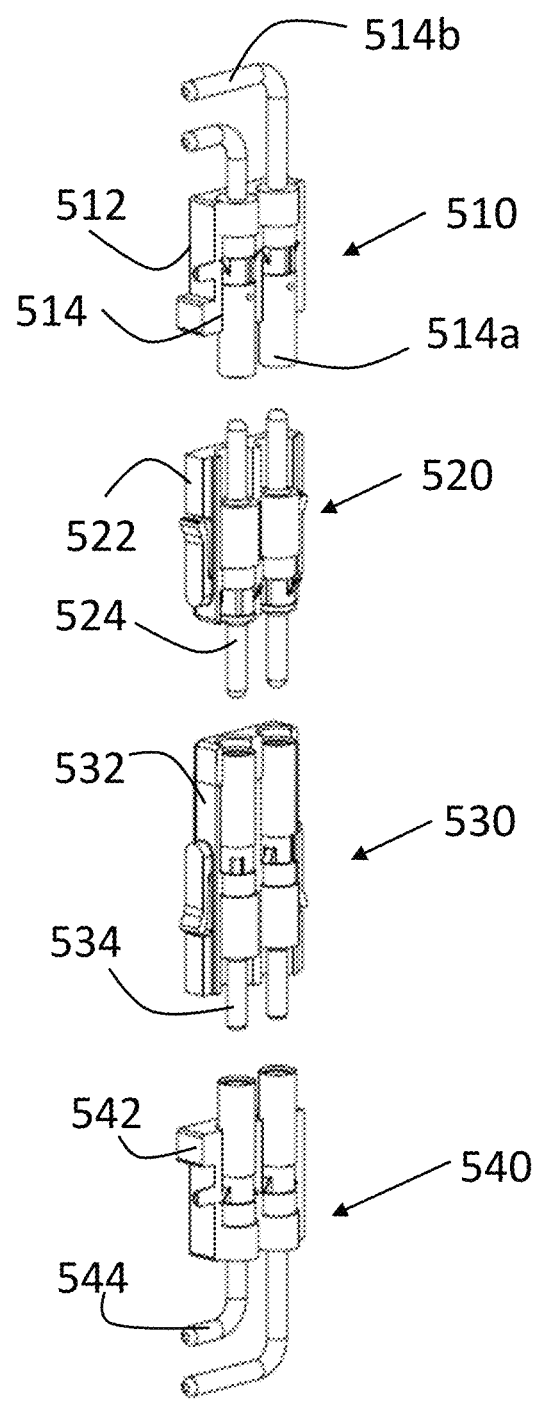
FIG. 5B is a cutaway top assembly view of a power contact assembly of a high life-cycle separable test adapter assembly in accordance with a preferred embodiment of the present invention.

As shown in FIGS. 5A and 5B, an interface system may have an ITA-side power contact right angle insert 510, an ITA side power contact pass-through insert 520, a receiver side power contact pass-through insert 530 and a receiver side power right angle insert 540. In this manner, both the receiver side and ITA side have replaceable pass-through inserts that provide for effectively infinite life cycles for the system by allowing for easy replacement of the contacts that are bearing the most wear, i.e., the contacts in the pass-through inserts.

As shown in FIGS. 6A and 6B, an interface system may have an ITA-side signal contact right angle insert 610, an ITA side signal contact pass-through insert 620, a receiver side signal contact pass-through insert 630 and a receiver side signal right angle insert 640. In this manner, both the receiver side and ITA side have replaceable pass-through inserts that provide for effectively infinite life cycles for the system by allowing for easy replacement of the contacts bearing the most wear, i.e., the contacts on the pass-through inserts.

Figure 7A:
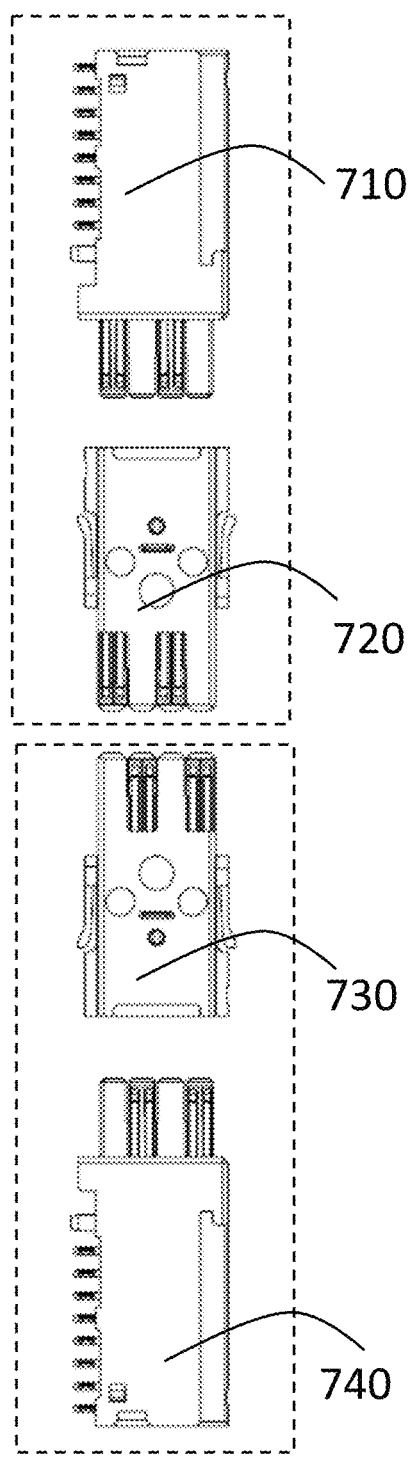
FIG. 7A is a top assembly view of a high-speed digital contact assembly of a high life-cycle separable test adapter assembly in accordance with a preferred embodiment of the present invention.
Figure 7B:
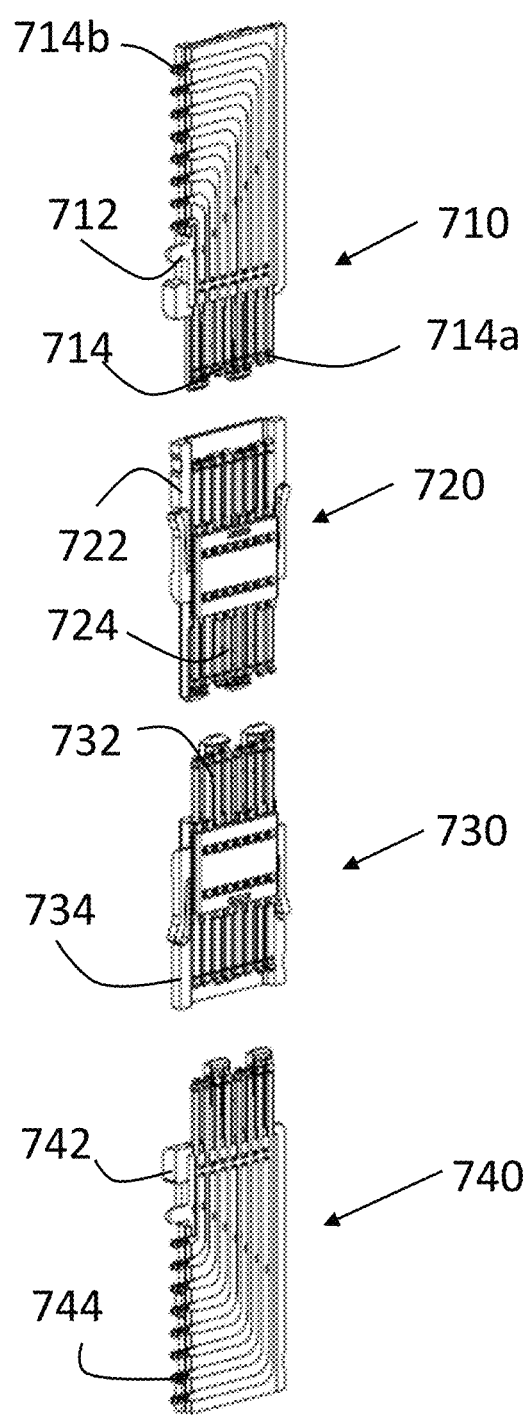
FIG. 7B is a cutaway top assembly view of a high-speed digital contact assembly of a high life-cycle separable test adapter assembly in accordance with a preferred embodiment of the present invention.

As shown in FIGS. 7A and 7B, an interface system may have an ITA-side data contact right angle insert 710, an ITA side data contact pass-through insert 720, a receiver side data contact pass-through insert 730 and a receiver side data right angle insert 740. In this manner, both the receiver side and ITA side have replaceable pass-through inserts that provide for effectively infinite life cycles for the system by allowing for easy replacement of the contacts bearing the most wear, i.e., the contacts on the pass-through inserts. With this system, the pass-through inserts in the test adapter can be removed from the front face of the test adapter frame. The same is true with the receiver, i.e., the pass-through inserts on the receiver side can be removed through the front face of the receiver frame. This allows easy replacement of the pass-through inserts without having to disassembly the test adapter or receiver.

All of the contacts may use a latch mechanism such as is disclosed in U.S. Pat. No. 9,246,286 to secure the various types of pass-through inserts into the ITA and receiver frames and use a tool or tools such as are disclosed in that patent to remove the pass-through inserts from the front of the ITA or receiver frame without having to disassembly the ITA or receiver to do so.

As shown in FIG. 1C, the ITA frame 210 has a front face 212, a rear face 214, and a plurality of slots 216 into which various pass-through inserts 520, 620, 720 are placed. The pass-through inserts of the different types (e.g., power, signal, data) are designed so each type can use the same size slots 216 in the ITA 210 frame for securing the insert in the ITA frame. In such a system, one type of pass-through insert, e.g., the power contact pass-through insert 520 in FIG. 1C, may occupy a plurality of slots (e.g., one pass-through insert occupying two slots), while another type of contact insert may occupy a single slot, e.g., the high speed data contact pass-through inserts 720 in FIG. 1C. In this manner, great flexibility in the configuration of the modules can be achieved.

One of the advantages of the present invention is flexibility in configuration of the test adapter and receiver. The system can be configured such that the test adapter and receiver have only one type of pass-through insert, e.g., all high-speed data pass-through inserts. Alternatively, it could be configured to have two different types of three or more types. Looking at the invention in this flexible context, the interface (100) has a frame (210) having a front face (212), a rear face (214) and a plurality of identical slots (216), a first pass-through insert (520, 620, 720) in the frame, the first pass-through insert having a housing (522, 622, 722) and a plurality of a first type of contact (524, 624, 724) in the housing (522, 622, 722), the first pass-through insert (520, 620, 720) being secured in the frame (210), a second pass-through insert in the frame (520, 620, 720), the second pass-through insert having a housing (522, 622, 722) and a plurality of a second type of contact (524, 624, 724) in the housing, the second type of contact being secured in the frame (210), wherein the second type of contact is different than the first type of contact. The first pass-through insert (620, 720) may be secured in one of the plurality of slots (216) in the frame (210). The first type of contact (620, 720) may be one of a signal contact and a high-speed data contact. The second pass-through insert (520) may be secured in a plurality of the of the plurality of slots (216) in the frame (210). The interface (100) may further comprise a first contact set (510. 610, 710) having a first end (514a, 614a, 714a) connected to the first pass-through insert and a second end (514b, 614b, 714b) adapted to connect to a printed circuit board and a second contact set (510, 610, 710) having a first end (514a, 614a, 714a) connected to the second pass-through insert and a second end (514b, 614b, 714b) adapted to connect to the printed circuit board.

In another embodiment, the present invention is an interface (100) having a test adapter assembly and a receiver assembly. The test adapter assembly further comprises a test adapter frame (210) having a front face (212), a rear face (214) and a plurality of identical slots (216), a plurality of first pass-through inserts (520, 620, 720) secured in the test adapter frame, each the first pass-through insert having a first housing (522, 622, 722) and a plurality of a first type of contact (524, 624, 724) in the first housing (522, 622, 722), the plurality of first pass-through inserts (520, 620, 720) being secured in the test adapter frame (210), and a plurality of second pass-through inserts in the test adapter frame (520, 620, 720), each the second pass-through insert having a second housing (522, 622, 722) and a plurality of a second type of contact (524, 624, 724) in the second housing, the second type of contact being secured in the test adapter frame (210), wherein the second type of contact is different than the first type of contact. The receiver assembly comprises a receiver frame having a front face, a rear face and a plurality of identical slots, a plurality of third pass-through inserts (530, 630, 730) in the receiver frame, each the third pass-through insert having a third housing (532, 632, 732) and a plurality of a third type of contact (534, 634, 734) in the third housing (532, 632, 732), the third type of contact being adapted to connect to the first type of contact, the plurality of third pass-through inserts (530, 630, 730) being secured in the receiver frame in positions corresponding to positions of the first pass-through inserts in the test adapter frame, and a plurality of fourth pass-through inserts in the receiver frame, each the fourth pass-through insert having a fourth housing (532, 632, 732) and a plurality of a fourth type of contact (534, 634, 734) in the fourth housing, the fourth type of contact being adapted to connect to the second type of contact and the plurality of fourth pass-through inserts being secured in the receiver frame in positions corresponding to positions of the second pass-through inserts in the test adapter frame.

In yet another embodiment, the present invention is an interface (100) having a test adapter assembly. The test adapter assembly comprises a test adapter frame (210) having a front face (212), a rear face (214) and a plurality of identical slots (216), a power pass-through insert (520) in the test adapter frame, the power pass-through insert (520) having a housing (522) and a plurality of power contacts (524) in the housing (522), the power pass-through insert (520) being secured in the frame (210), a signal pass-through insert (620) in the test adapter frame (210), the signal pass-through insert (620) having a housing (622) and a plurality of signal contacts (624) in the housing, the signal pass-through insert being secured in the test adapter frame (210).

The foregoing description of the preferred embodiment of the invention has been presented for purposes of illustration and description. It is not intended to be exhaustive or to limit the invention to the precise form disclosed, and modifications and variations are possible in light of the above teachings or may be acquired from practice of the invention. The embodiment was chosen and described in order to explain the principles of the invention and its practical application to enable one skilled in the art to utilize the invention in various embodiments as are suited to the particular use contemplated. It is intended that the scope of the invention be defined by the claims appended hereto, and their equivalents. The entirety of each of the aforementioned documents is incorporated by reference herein.

What is claimed is:

1. An interface comprising:
a frame having two pairs of opposing sides forming a front face, a rear face, an opening between said front face and said rear face, and a plurality of identical slots facing said opening and spaced on each side in one of said two pairs of opposing sides;
a first pass-through insert secured in a first pair of opposing slots in said frame, said first pass-through insert having a housing and a plurality of a first type of contact in said housing, said first pass-through insert being secured in said frame;
a second pass-through insert secured in a second pair of opposing slots in said frame, said second pass-through insert having a housing and a plurality of a second type of contact in said housing, said second type of contact being secured in said frame, wherein said second type of contact is different than said first type of contact.

2. An interface according to claim 1 wherein said first pass-through insert is secured in one of said plurality of slots in said frame.

3. An interface according to claim 2 wherein said first type of contact comprises one of a signal contact and a high-speed data contact.

4. An interface according to claim 1 wherein said second pass-through contact is secured in a plurality of said plurality of slots in said frame.

5. An interface according to claim 1, further comprising:
a first contact set having a first end connected to said first pass-through insert and a second end adapted to connect to a printed circuit board; and
a second contact set having a first end connected to said second pass-through insert and a second end adapted to connect to said printed circuit board.

6. An interface comprising:
a test adapter assembly comprising:
a test adapter frame having first and second pairs of opposing sides forming a front face, a rear face, an opening between said front face and said rear face, and a plurality of identical slots spaced on each side in said first pair of opposing sides in said test adapter frame and facing said opening in said test adapter frame;
a plurality of first pass-through inserts secured in secured in a first pair of said slots on opposing sides of said test adapter frame, each said first pass-through insert having a first housing and a plurality of a first type of contact in said first housing, said plurality of first pass-through inserts being secured in said test adapter frame; and
a plurality of second pass-through inserts secured in a second pair of said slots on opposing sides of said test adapter frame, each said second pass-through insert having a second housing and a plurality of a second type of contact in said second housing, said second type of contact being secured in said test adapter frame, wherein said second type of contact is different than said first type of contact; and a receiver assembly comprising:
a receiver frame having third and fourth pairs of opposing sides forming a front face, a rear face, an opening between said front face and said rear face, and a plurality of identical slots spaced on each side in said third pair of opposing sides and facing said opening in said receiver frame;
a plurality of third pass-through inserts secured in pairs of slots on opposing sides of said receiver frame, each said third pass-through insert having a third housing and a plurality of a third type of contact in said third housing, said third type of contact being adapted to connect to said first type of contact, said plurality of third pass-through inserts being secured in said receiver frame in positions corresponding to positions of said first pass-through inserts in said test adapter frame; and
a plurality of fourth pass-through inserts secured in a fourth pair of slots on opposing sides of said receiver frame, each said fourth pass-through insert having a fourth housing and a plurality of a fourth type of contact in said fourth housing, said fourth type of contact being adapted to connect to said second type of contact and said plurality of fourth pass-through inserts being secured in said receiver frame in positions corresponding to positions of said second pass-through inserts in said test adapter frame.

7. An interface according to claim 6, further comprising:
a first contact set having a first end connected to one of said plurality of first pass-through inserts and a second end adapted to connect to a printed circuit board; and
a second contact set having a first end connected to one of said plurality of second pass-through inserts and a second end adapted to connect to said printed circuit board.

8. An interface according to claim 7, wherein said first type of contact comprises one of a signal contact and a high-speed data contact.

9. An interface according to claim 8, wherein said second type of contact comprises a power contact.

10. An interface according to claim 6, wherein said test adapter further comprises
a fifth pass-through insert secured in a plurality of pairs of slots on opposing sides of said test adapter frame, each said fifth pass-through insert having a fifth housing and a plurality of a fifth type of contact in said fifth housing, said fifth type of contact being secured in said test adapter frame, wherein said fifth type of contact is different than said first, second, third and fourth types of contacts.

11. An interface according to claim 10, wherein said receiver further comprises:
a sixth pass-through insert secured in a plurality of pairs of slots in opposing sides of said receiver frame, each said sixth pass-through insert having a sixth housing and a plurality of a sixth type of contact in said sixth housing, said sixth type of contact being adapted to connect to said fifth type of contact and said plurality of sixth pass-through inserts being secured in said receiver frame in positions corresponding to positions of said fifth pass-through inserts in said test adapter frame.

12. An interface comprising:
a test adapter assembly comprising:
a test adapter frame having two pairs of opposing sides forming a front face, a rear face, an opening between said front face and said rear face, and a plurality of identical slots facing said opening and spaced on each side in one of said two pairs of opposing sides;

a power pass-through insert secured in a first pair of slots in said test adapter frame, said power pass-through insert having a housing and a plurality of power contacts in said housing, said power pass-through insert being secured in said frame;

a signal pass-through insert secured in a second pair of slots in said test adapter frame, said signal pass-through insert having a housing and a plurality of signal contacts in said housing, said signal pass-through insert being secured in said test adapter frame.

13. An interface according to claim 12, further comprising:

a high-speed data pass-through insert in said test adapter frame, said high-speed data pass-through insert having a housing and a plurality of high-speed data contacts in said housing, said high-speed data pass-through insert being secured in said test adapter frame.

* * * * *